United States Patent
Savariar-Hauck et al.

(10) Patent No.: US 6,599,676 B2
(45) Date of Patent: Jul. 29, 2003

(54) PROCESS FOR MAKING THERMAL NEGATIVE PRINTING PLATE

(75) Inventors: Celin Savariar-Hauck, Breitenberge (DE); Hans-Joachim Timpe, Baumhofstrasse (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 29 days.

(21) Appl. No.: 10/039,164

(22) Filed: Jan. 3, 2002

(65) Prior Publication Data

US 2003/0124454 A1 Jul. 3, 2003

(51) Int. Cl.[7] .............................................. G03F 7/038
(52) U.S. Cl. .............................. 430/270.1; 430/278.1; 430/302; 430/350; 430/394; 430/401; 430/434; 430/494; 430/944; 430/945; 430/964; 101/463.1; 101/467
(58) Field of Search ........................... 430/270.1, 278.1, 430/281.1, 302, 348, 350, 394, 401, 434, 494, 944, 945, 964; 101/463.1, 467

(56) References Cited

U.S. PATENT DOCUMENTS

| | | | |
|---|---|---|---|
| 4,020,762 A | 5/1977 | Peterson | 101/467 |
| 4,356,254 A | 10/1982 | Takahashi et al. | 430/296 |
| 4,927,741 A | 5/1990 | Garth et al. | 430/309 |
| 5,340,699 A | 8/1994 | Haley et al. | 430/302 |
| 5,372,907 A | 12/1994 | Haley et al. | 430/157 |
| 5,380,622 A | 1/1995 | Roser | 430/325 |
| 5,491,046 A | 2/1996 | DeBoer et al. | 430/302 |
| 5,631,119 A | 5/1997 | Shinozaki | 430/326 |
| 6,083,658 A * | 7/2000 | Kunita et al. | 430/270.1 |
| 6,218,083 B1 * | 4/2001 | McCullough et al. | 430/326 |
| 6,326,123 B1 * | 12/2001 | West et al. | 430/270.1 |
| 6,458,511 B1 * | 10/2002 | Wittig et al. | 430/302 |
| 6,489,078 B1 * | 12/2002 | Van Damme et al. | 430/170 |

FOREIGN PATENT DOCUMENTS

| | | | | |
|---|---|---|---|---|
| JP | 1997000366147 | | 7/1999 | |
| JP | 1998000260396 | | 3/2000 | |
| JP | 19999000068430 | | 9/2000 | |
| WO | WO 99/21725 | * | 5/1999 | B41M/5/36 |

* cited by examiner

Primary Examiner—Janet Baxter
Assistant Examiner—Barbara Gilliam
(74) Attorney, Agent, or Firm—RatnerPrestia (57) ABSTRACT

A process for making thermally imageable negative working compositions comprising the steps of:

(1) providing a patterning composition layer on a substrate, said patterning composition comprising:
   (a) at least one thermal-generator acid generator,
   (b) at least one cross-linking resin or compound;
   (c) at least one binder resin comprising a polymer containing at least one reactive pendent group selected from the group, consisting of hydroxyl, carboxylic acid, sulfonamide, alkoxymethylamide and mixtures thereof; and
   (d) at least one infrared absorber;
(2) subjecting the patterning composition layer to a two-stage radiation exposure;
   (a) one stage being a flood UV-exposure; and
   (b) the other stage being a imagewise infrared exposure stage;
(3) treating the exposed patterning composition with heat energy; and
(4) developing the heat treated, exposed patterning composition with an aqueous alkaline developer to remove the non-imaged areas of the patterning composition and leaving the imaged areas substantially unaffected.

14 Claims, 5 Drawing Sheets

PROCESS FOR MAKING THERMAL NEGATIVE PRINTING PLATE

BACKGROUND OF THE INVENTION

1. Field of the Invention

The present invention relates to a process for making a thermally imageably, negative working printing plate.

2. Brief Description of Art

The use of thermally sensitive, negative working printing plates comprising patterning compositions coated over a hydrophilic underlayer is well known. Several methods for forming images using such compositions are known. All these methods are based on the principle of introducing a differentiation in properties between the image-wise exposed and non-exposed parts of thermally sensitive composition, e.g. difference in solubility, adhesion, tackiness, permeability etc. Such generated difference may be subsequently employed in an additional developing step to produce a visible image. A difference in solubility in an aqueous developer between exposed and non-exposed parts of the thermally sensitive compositions is often used for the production of lithographic printing plates.

The use of the difference in solubility is described in the following documents:

U.S. Pat. No. 4,356,254 (Takahashi et al.) is directed to an image-forming method wherein a light-sensitive material comprising a support having a light-sensitive layer provided on the support. The light-sensitive layer containing a quinonediazide sensitizer. This light-sensitive material is imagewise exposed with a high intensity energy beam (e.g. a laser beam) to make the o-quinonediazide compound alkaline soluble in those areas that are imaged; then overall heating the light-sensitive material to insolubilize the exposed areas; then overall exposing (flood exposing) the thus-processed material with light to solubilize unexposed areas; and then developing with an alkaline developer to provide a negative image by removing alkaline soluble areas of said layer. This reference does not teach employing acid generator-type light sensitive layers.

U.S. Pat. No. 4,356,254 (Stahlhofen et al.) describes a process for producing negative relief copies using a light-sensitive material that contains either a benzoquinone diazide compound or a naphthoquinone diazide compound. This process includes the steps of imagewise exposing the light-sensitive material; then heating the light-sensitive material; then flood exposing the thus processed material which is followed by developing the material, whereby the layer areas which were not struck by light in the first imagewise exposure are washed off. This reference uses quinone diazides as the sensitizers in the light-sensitive material and does not teach the use of acid generator-type sensitizer.

U.S. Pat. No. 4,927,741 (Garth et al.) describes a method for the reversal of photosoluble lithographic printing plates having an aromatic quinone diazide-containing coating. This method includes the steps of (1) imagewise exposing a portion of the coated surface with UV lamp to render that portion soluble in a developer; (2) heating the plate and coating to render the imagewise exposed relatively insoluble in the developer; (3) then overall irradiating the coated surface to solubilize the remaining portion of the coated surface not previously exposed, wherein the overall irradiation step (3) is applied through water. This process does not teach the use of acid generator-type sensitizers, but instead is limited to quinone diazide sensitizers.

U.S. Pat. No. 5,340,699 (Haley) teaches a method of forming a lithographic printing surface comprising the steps of: (a) providing a lithographic printing plate comprising a support and an imaging layer containing an admixture of (1) a resole resin, (2) a novalac resin, (3) a latent Bronsted acid and (4) an infrared absorber; (b) imagewise exposing said lithographic printing plate to activating radiation; (c) heating said lithographic printing plate to provide reduced solubility in exposed areas and increased solubility in unexposed areas; and (d) contacting said lithographic printing plate with an aqueous alkaline developing solution to remove the unexposed areas thereof and thereby form a lithographic printing surface. This process does not teach using a heat treatment between the flood exposure step (c) and the development step (d).

U.S. Pat. No. 5,380,622 (Roser) describes the production of negative relief copies of a recording plate that uses naphthoquinone diazide compounds as the photosensitive compounds. This process includes the step of: (1) imagewise exposing the recording plate using UV, metal halide, xenon or arc lamps; (2) then heating the exposed plate; (3) then uniform exposing the plate to the same light source used in the imagewise exposure; and (4) then developing the thus-processed recording plate with an aqueous alkaline developer to dissolve the alkali-soluble components and form a negative relief copy. This process also does not teach the use of acid generator-type sensitizers, but is limited to quinone diazide sensitizers.

U.S. Pat. No. 5,631,119 (Shinozaki) teaches an image formation process that employs photosensitive composition layer containing a quinone diazide photosensitizer and includes the steps of: (1) exposing the entire surface (flood exposing) of the photosensitive composition layer, to light rays (normally at 290 to 500 manometers) that render the quinone diazide compound soluble in an alkaline developer; (2) then imagewise heating the flood exposed photosensitive composition layer (such as with a thermal head printer); and (3) then developing with an aqueous alkaline solution.

U.S. Pat. No. 5,922,502 (Van Damme et al.) teaches a method for making a lithographic printing plate comprising the steps of (a) imagewise exposing an imaging element having a photosensitive layer and a thermosensitive layer with a laser thereby imagewise rendering the thermosensitive layer transparent to light for which said photosensitive layer has spectral sensitivity; (b) overall exposing the imaged element with light for which said photosensitive layer has spectra sensitivity; and (c) developing the element. This process does not teach an intermediate heat treating step.

European Patent Application EP 0 851 296 A1 (Habenhauer et al.) teaches a process similar to that in U.S. Pat. No. 5,922,502. Again, no intermediate heat treatment is taught.

Japanese Published Patent Application No. 11190902 A2 (Kunio) teaches making a heat mode recording lithographic printing plate having a image forming layer containing a quinone diazide compound and an infrared absorber. This plate is formed by (1) imagewise exposing the image forming layer with laser beams; (2) then flood exposing it to ultraviolet rays; and (3) then developing it with an aqueous alkaline developer.

Japanese Published Patent Application No. 267266 A2 (Mitsumasa) teaches a method for making lithographic printing plates that includes the steps: (1) imagewise exposing a photosensitive layer to visible laser beams; (2) then developing the imagewise exposed photosensitive layer; and (3) then flood exposing the developed photosensitive layer to UV light.

Japanese Published Patent Application No. 089478 A2 (Yasuo) teaches a method for making a photopolymerizable printing plate wherein a photosensitive layer is imagewise exposed to specified exposure light using a laser, then developed and then flood exposed to light at least 100 times the quantity employed in the imagewise exposure.

As illustrated above thermally sensitive compositions can be used in a variety of methods to reproduce images. Among these methods those, which employed patterning compositions containing light-sensitive material that is a mixture of an acid generator, a cross-linking resin or compound, a binder resin and an infrared (IR) absorber, are commonly used for the production of printing plates. The plates are imaged by imagewise exposure to IR radiation to produce imaged areas, which after further processing steps are insoluble in a developer liquid. These parts consist of a coating which results after acid catalyzed network formation between binder resin and crosslinker.

However, these thermal imaging systems require a heat treatment step after IR imaging and before development (commonly referred to as a preheat step) to complete image formation. The window of operation of these compositions was found to be dependent on the amount of heat exposed during both the IR imaging and the preheat step. When inadequate levels of heat were applied to the imaged areas during IR radiation imaging or preheat, then incomplete image formation or weak images may result on the printing press. In contrast, when the heat energy during the preheat step is too high, both imaged and non-imaged parts are hardened. This phenomenon is referred as fogging, the temperature at which that is first observed as first fogging (in following referred as F).

The thermal sensitivity of the resulting printing plate enables them to function, but for some applications, processing a desirable number of plates within a short period of time is problematic. The most important factor for increasing this number is the amount of acid produced during the IR exposure.

The use of high-performance lasers or laser diodes, which employs higher power than previously used imaging equipment and, thus, leading to a shorter exposure time, is sometimes also problematic with some patterning composition layers. When lasers are used as the exposure equipment, portions of the patterning layer may be ablatively imaged, which decreases the amount of coating remaining at the surface after processing, and decreasing the number of copies during print. When laser diode arrays are used as the exposure equipment, then so-called banding can occur indicated by a strip-wise color difference at the surface of processed plates.

Accordingly, there is a need for an improved method that will widen the window of operation of patterning compositions, based on acid generation during imagewise IR exposure, thereby decreasing the required IR exposure energy, improve processability, chemical resistance and the performance of printing plates. The present invention provides an excellent solution to that need.

BRIEF SUMMARY OF THE INVENTION

Therefore, one aspect of the present invention is directed to a process for making thermally imageable negative working compositions comprising the steps of:

(1) providing a patterning composition layer on a substrate, said patterning composition comprising:
 (a) at least one thermal-generated acid generator;
 (b) at least one cross-linking resin or compound;
 (c) at least one binder resin comprising a polymer containing at least one reactive pendent group selected from the group consisting of hydroxyl, carboxylic acid, sulfonamide, alkoxymethylamide and mixtures thereof; and
 (d) at least one infrared absorber;

(2) subjecting the patterning composition layer to a two-stage radiation exposure;
 (a) one stage being a flood UV-exposure stage; and
 (b) the other stage being a imagewise infrared exposure stage;

(3) treating the exposed patterning composition with heat energy; and (4) developing the heat treated, exposed patterning composition with an aqueous alkaline developer to remove the non-imaged areas of the patterning composition and leaving the imaged areas substantially unaffected.

According to this invention, it has been found that when selected negative working patterning compositions that are both sensitive in the IR and UV wavelengths are treated with both UV flood exposure and the IR imagewise exposure (in either order) prior a preheat step, the speed can be increased and the preheat and banding latitude are widened. A preferred range of UV exposure exists as overexposure would result in too early fogging, a too low working temperature which may result in insufficient cross-linking. The required level of acid can be produced easily and well defined by common UV exposure devices. Advantageously, such devices are installed prior the preheat segment of the processing line for the plate. Such lines are described in U.S. patent application Ser. No. 09/573,126, filed May 17, 2000.

This invention is useful in processing negative working, thermal imaging plates that use patterning compositions containing acid generator and cross-linked resin precursors. One example of such patterning composition is DITP plates commercially available from Kodak Polychrome Graphics LLC.

This invention also increases the preheat and banding latitude and increases the IR sensitivity of the plate, thereby also reducing ablation.

DETAILED DESCRIPTION OF THE INVENTION

The first step of the present process is providing a patterning composition layer on a substrate. The preferred patterning compositions contain a mixture of the following components:

(a) an acid generator which is sensitive to UV radiation;
(b) a cross linking resin or compound;

(c) a binder resin comprising a polymer containing reactive pendant groups selected from OH, carboxylic acid, sulfonamide, and alkoxymethylamides;

(d) an IR absorber; and (e) optionally, a UV sensitizer for the acid generator.

Prior art disclosing such imageable compositions include U.S. Pat. No. 5,919,601 (Nguyen et al.) and U.S. Pat. No. 5,372,915 (Haley et al.).

The supporting substrate to be used as the lithographic base in the present invention is a dimensionally stable plate-like substance, and examples thereof include paper, paper laminated with a plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-described metals.

A polyester film or an aluminum plate is preferable as a substrate in the present invention. In particular, an aluminum plate is particularly preferable since it has good dimensional stability and can be provided at a relatively low cost. Examples of preferable aluminum alloy plates comprising aluminum as the main component and trace quantities of different elements. Furthermore, plastic films at which aluminum is laminated or deposited can also be used. Examples of different elements which may be included in the aluminum alloy include silicon, iron, manganese, copper, magnesium, chrome, zinc, bismuth, nickel, and titanium. The amount of the different elements in the alloy is preferably 2% by weight or less. The thickness of the aluminum plate to be used in the present invention is from about 0.1 mm to 0.6 mm, preferably from 0.15 mm to 0.4 mm, and more preferably from 0.2 mm to 0.3 mm.

When an aluminum plate is used as a substrate, it is desirable to conduct roughening treatment prior to the coating with the polymeric first layer. Also, prior to this roughening of the aluminum plate, a degreasing treatment with a surfactant, an organic solvent, or an aqueous alkaline solution may be conducted to remove the rolling oil from the surface as needed.

The surface roughening treatment of an aluminum plate can be implemented using various methods, such as a mechanically roughening method, an electrochemically roughening method in which a plate surface is electrochemically dissolved, and a chemically roughening method in which a plate surface is selectively dissolved using chemicals. As the mechanical method, known methods such as a ball abrasion method, brush abrasion method, blast abrasion method, and buff abrasion method can be used. As the electrochemically roughening method, a method in which an alternating current or direct current is applied to a plate in an electrolytic solution containing a hydrochloric acid or nitric acid can be used. Further, a method combining both (electrochemical and mechanical) methods as disclosed in JP-A No. 54-63,902 can be used.

The aluminum plate to which a surface roughening treatment as described above has been applied may be further subjected, if necessary, to an alkaline etching treatment or a neutralizing treatment, followed by an anodizing treatment so as to improve the water retention property and the abrasion resistance property of the surface. As the electrolyte used in the anodizing treatment of the aluminum plate, various electrolytes that can form a porous oxide film may be used. In general, sulfuric acid, phosphoric acid, oxalic acid, or a mixture thereof can be used as the electrolyte. The concentration of the electrolyte is suitably adjusted according to the type of electrolyte.

If the amount of an oxide film produced by anodization is less than 1.0 g/m$^2$, durability of the plate may be insufficient, and scratches may be easily produced in a non-image portion of the planographic printing plate, thereby easily causing so-called "scratch toning" in which ink adheres to such scratches in printing.

After the anodizing treatment, a hydrophilicity-increasing treatment may be applied to the aluminum surface, if necessary. Examples of the hydrophilicity-increasing treatment to be used in the present invention include an alkaline metal silicate (such as an aqueous solution of sodium silicate) method as disclosed in U.S. Pat. Nos. 2,714,066, 3,181,461, 3,280,734 and 3,902,734. In this method, the support (aluminum plate) is treated by immersing or electrolyzing the support, in an aqueous solution of sodium silicate. Other examples include a method of treating the aluminum plate with potassium fluorozirconate disclosed in JP-B No. 36-22063 and a method of treating it with polyvinyl phosphonate disclosed in U.S. Pat. Nos. 3,276,868, 4,153,461 and 4,689,272.

The thermal-activated acid generator of the present invention promotes the matrix-forming reaction between the crosslinking resin and the binder resin, when the composition is exposed to a suitable radiation source. Thermal-activated acid generators suitable for use in the invention include, for example, straight or branched-chain $C_1$–$C_5$ alkyl sulfonates, aryl sulfonates, N—$C_1$–$C_5$ alkysulfonyl sulfonamides, salts containing an onium cation and non-nucleophilic anion; and combinations thereof. Particularly useful aryl sulfonates include, for example, benzoin tosylate, 2-hydroxymethylbenzoin tosylate and 2,6-dinitrobenzyl tosylate. Particularly useful N-alkylsulfonyl sulfonamides include N-methanesulfonyl-p-toluene sulfonamide and N-methanesulfonyl-2,4-dimethylbenzene sulfonamide. Particularly useful salts include, for example, those in which the onium cation is selected from iodonium, sulphonium, phosphonium, oxysulphoxonium, oxysulphonium, sulphoxonium, ammonium and diazonium, and the non-nucleophilic anion is selected from tetra-fluoroborate, hexafluorophosphate, hexafluoroarsenate, hexafluoroantimonate, triflate, tetrakis(pentafluorophenyl) borate, pentafluoroethyl sulfonate, p-methyl-benzyl sulfonate, ethyl sulfonate, trifluoromethyl acetate and pentafluoroethyl acetate. Preferred are salts wherein the onium cation is diazonium, iodonium or ammonium. The thermal-activated acid generator is incorporated in the composition of the invention in an amount of from about 1 to 25, preferably 5 to 20, weight percent (based on the weight of the composition).

Another component of the radiation sensitive composition of this invention is a crosslinking resin. Preferably, the crosslinking resin is selected from resole resins, $C_1$–$C_5$ alkoxymethyl melamine and glycoluril resins, poly(straight or branched-chain $C_1$–$C_5$-alkoxy-methylstyrene), poly(straight or branched-chain $C_1$–$C_5$-alkoxy-methylacrylamide) derivatives and combinations thereof. More preferably, the crosslinking resin is a resole resin prepared from a straight or branched-chain $C_1$–$C_5$ alkylphenol and formaldehyde; a tetra straight or branched-chain $C_1$–$C_5$-alkoxymethyl glycoluril; polymers of (4-methoxymethylstyrene); [(N-methoxymethyl)acrylamidel]; [(N-iso-butoxymethyl)acrylamide]; and butylated phenolic resins.

The crosslinking resin is incorporated in the composition of this invention in an amount of from about 5 to 40, preferably 10 to 25, weight percent (based on the weight of the composition).

Another component of the radiation sensitive composition of this invention is a binder resin. The binder resin is one or more polymers containing first reactive pendant groups selected from carboxylic acid, sulfonamide and alkoxymethyl amide, said groups being capable of undergoing an acid-catalyzed condensation reaction with the crosslinking resin at a temperature in the range of about 60° C. to about 200° C. to form a crosslinked polymer. Preferably, said polymers additionally contain second reactive pendant groups capable of undergoing acid-catalyzed condensation with the crosslinking resin at a temperature in the range of about 60° C. to about 200° C. to form a crosslinked polymer, said second groups being selected from hydroxy and alkoxymethyl amide.

Suitable examples of such polymers include poly(4-hydroxystyrene), poly(4-hydroxystyrene/methylmethacrylate), novolac resin, poly(2-hydroxyethylmethacrylate/cyclohexylmethacrylate), poly(2-hydroxyethylmethacrylate/methylmethacrylate), poly(styrene/butylmethacrylate/methylmethacrylate/methacrylic acid), poly(butylmethacrylate/methacrylic acid), poly(vinylphenol/2-hydroxyethylmethacrylate), poly(styrene/n-butylmethacrylate/2-hydroxyethylmethacrylate/methacrylic acid), poly(styrene/ethylmethacrylate/2-hydroxyethylmethacrylate/methacrylic acid) and poly(N-methoxymethyl methacrylamide/2-phenylethyl methacrylate/methacrylic acid.

The binder resin is present in an amount of about 20 to about 65, preferably 30 to about 55, weight percent (based on the weight of the composition). While not wishing to be bound by theory, it is believed that the crosslinking and binder resins are co-reactive resins. The designations of "binder resin" and "crosslinking resin" may therefor be used interchangeably.

The radiation sensitive composition of this invention also requires, as a component, an infrared absorber to render the composition sensitive to infrared radiation and cause the printing plate to be imageable by exposure to a laser source emitting in the infrared region. The infrared absorber can be a dye and/or pigment. A wide range of such compounds is well known in the art and include dyes and/or pigments selected from triarylamine dyes, thiazolium dyes, indolium dyes, oxazolium dyes, cyanine dyes, polyaniline dyes, polypyrrole dyes, polythiophene dyes, thiolene metal complex dyes, carbon black and phthalocyanine pigments. Where a dye and/or pigment is employed as the infrared absorber, it is used in an amount from about 2 to about 30, preferably about 5 to about 20 weight percent (based on the weight of the composition).

The radiation-sensitive composition of this invention may optionally be sensitized to UV radiation by incorporating, as a component of the composition, a UV sensitizer for the acid generator. This may be essential when the acid generator is not completely sensitive to exposure with common used UV exposure devices. Sensitizers suitable for use in this invention include, for example, monomolecular or polymeric compounds containing an anthracene moiety, thioxanthone moiety, or alkylaminobenzo-phenone moiety. Particularly useful molecular compounds include anthracene, 9-methylanthracene, 9-methocyanthracene, 9.10-dimethoxyanthracene, 9.10-diphenylanthracene, thioxanthone, 2-chlorothioxanthone, 4-chlorothioxanthone, 2-isopropylthioxanthone, 4-isopropyl-thioxanthone, 1.4-diethylthioxanthone and 2-hydroxy-(3.4-dimethyl-9-oxo-9H-thioxanthone-2-yloxy)-N.N.N-trimethyl-trimethyle-1-propane ammonium chloride.

Other components which can optionally be incorporated in the composition of this invention include an indicator and a coloring dye; a secondary acid generator; plastizer; and surfactant. Examples of these optional ingredients are disclosed in U.S. Pat. No. 5,919,601.

The patterning composition is preferably prepared by adding the above-noted components to a suitable solvent or solvent combination to dissolve or disperse them in the solvent. Suitable solvents include methyl lactate, ethyl lactate, methyl ethyl ketone, diethyl ketone, cyclohexanone, acetone, methanol, ethanol, propanol, methoxypropyl glycol (DOWANOL PM) and water. These solvents are used alone or in combinations thereof.

The concentration of the above-noted solid components in the solvent is preferably from about 1 to about 30% by weight, more preferably from 3 to 25% by weight and most preferably from 5 to 20% by weight, of the solvent.

The patterning composition is coated onto the above-noted substrate by any known coating technique. Examples of such coating technology include rotation or spin coating, slot coating, wire bar coating, dip coating, air knife coating, roll coating, blade coating, curtain coating and the like. The preferred method is slot coating.

The patterning composition is preferably dried to a suitable temperature to remove excess solvent. This drying may be carried out in a hot air drier or infrared ray dryer or the like, preferably at temperatures from about 40° C. to about 150° C. for 30 seconds to 10 minutes.

The second step of the present process is subjecting the patterning composition layer to a two stage exposure with different types of radiation. One stage is flood exposing the patterning to UV radiation. The other stage is exposing the patterning composition to an imagewise exposure with infrared radiation. The present invention contemplates that either stage may be carried out first.

The flood exposing with UV radiation can be carried out with any common UV light source for a predetermined time. As a light source of the UV radiation, it is possible to use a mercury lamp, a xenon lamp, xenon lamp, a carbon arc lamp, a tungsten lamp, a fluorescent lamp and sunlight, and the like. Generally, light from any source that has a wavelength in the ultra violet range (preferably about 290 nm to about 500 nm) may be used. The energy needed for the UV flood exposure depends on the UV sensitivity of the acid generator used or the sensitization efficiency of sensitizer when used. Normally, the overall exposure energy will be from about 5 to about 100 mJ/cm$^2$.

The IR imagewise exposure stage is preferably carried out by exposing the patterning composition layer to infrared radiation (IR) by scanning a laser beam modulated by an image signal. This IR imaging may be carried out by well-known methods. For example, the patterning composition layer may be imaged with a laser or an array of lasers emitting modulated IR radiation in a wavelength region that is absorbed by the IR absorber. IR radiation, especially IR radiation in the range of 750 to 1200 nm, preferably about 800 nm to about 1125 nm, is typically used for imaging thermally imageable elements. Imaging is conveniently carried out with a laser emitting at about 830 or at about 1056 nm. The IR exposure energy is preferably from about 30 to about 500 mJ/cm$^2$; more preferably from about 30 to about 350 mJ/cm$^2$, and most preferably from about 50 to about 175 mJ/cm$^2$. Suitable commercially available imaging devices include imagesetters such as the Creo Trendsetter (CREO, British Columbia, Canada) and the Gerber Crescent 42T (GERBER, Brussels, Belgium). The time between the UV flood exposure and exposure with a IR laser can be somewhat prolonged. At ambient temperatures of about 10 to about 35° C., laser exposure can be postponed as long as 24 hours.

The third step of the present process is subjecting the image patterning composition layer to sufficient heat energy to heat treat the imaged portions of the patterning composition layer.

After the 2 stage exposure, the patterning composition is heated. This heating operation can be effected by radiation, convection or contact with heated surfaces, for example, with rollers. Preferable continuous ovens are used which commonly employ hot air as heat-transferring medium. In such set ups, for a given processing speed the temperature range of the heat treatment is preferably set around the fog point of the plate containing the patterning composition. For a given set up and a given processing speed the fog point is defined as the minimum temperature required to render a thermal plate non-processable. In a continuous oven, the applied temperature is preferably −10° C. from the fog point, more preferably −7° C. from the fog point and most preferably −5° C. from the fog point. The duration of heating can vary widely, depending on the method chosen for the application of heat as well as the other steps in the process. If a heat-transferring medium is used, the heating time will preferably be from about 30 seconds to about 5 minutes, more preferably from about 1 minute to about 3 minutes.

The fourth step of the present process is developing the exposed patterned composition layer with an aqueous developing solution. The developing solution used for the development processing may be any liquid or solution that can penetrate and remove the unexposed regions without substantially affecting the complimentary exposed regions. While not being bound by any theory or explanation, it is believed that image discrimination is based on kinetic effect. The unexposed regions are removed more rapidly in the developer than the exposed regions. Development is carried for a long enough time to remove the unexposed regions in the developer, but not long enough to remove the exposed regions. The preferred time in the developer is from about 20 to 120 seconds. Hence the unexposed regions are described as being "soluble" or "removable" in the developer because they are removed, and dissolved and/or dispersed, more rapidly in the developer than the exposed regions.

Useful developers are aqueous solutions having a pH of about 7 or above. Preferred aqueous alkaline developers are those that have a pH between 8 and about 13.5, typically at least about 11, preferably at least about 12. Useful developers include commercially available developers such as Goldstar, Greenstar, MX1710, 4020, 9005 and 956 aqueous alkaline developers each available from Kodak Polychrome Graphics LLC. Developers are described for example in Yamasue, U.S. Pat. No. 4,259,434, Seino U.S. Pat. No. 4,452,880, Miller U.S. Pat. No. 5,851,735, Eckler U.S. Pat. No. 5,998,102, Miro U.S. EP-A-0732628, Toyama, GB-A-2276729 and Fiebag U.S. Pat. No. 6,143,479.

Development is typically carried out in a processor equipped with an immersion type developing bath, a section for rinsing with water, a gumming section, a drying section and a conductivity measuring unit. Typically the developer is applied to the imaged precursor by rubbing or wiping the element with an applicator containing the developer. Alternatively, the imaged precursor may be brushed with the developer or the developer may be applied to the precursor by spraying the element with sufficient force to remove the unexposed regions. In either instance, a printing plate is produced. Development may be carried out in a commercially available processor, such as a Mercury Processor and Quartz Processor (both from Kodak Polychrome Graphics). Preferably, the developer temperature is from about 18° C. to about 30° C., more preferably about 22° C. to about 25° C. Following development, the printing plate is rinsed with water and dried. Drying may be conveniently carried out by IR heaters or with hot air. After drying, the printing plate may be treated with a gumming solution. A gumming solution comprises one or more water soluble polymers, for example polyvinylalcohol, polymethacrylic acid, polymethacrylamide, polyhydroxyethylmethacrylate, polyvinylmethacrylate, gelatin and polysaccharide such as dextrin, pullulan, cellulose, gum arabic and alginic acid. A preferred material is gum arabic.

While post-development heating or other operation is normally not necessary for this invention, such operations may be preferred for some applications.

The images obtained by the above described processing are preferably usable for the manufacture of printing plate precursors. In addition, however, they may be used in recording materials for creating images on suitable carriers and receiving sheets, for creating reliefs that may serve as printing plates, screens and the like, for resists during the manufacture of micro electronic elements.

The present invention is further described in detail by means of the following Examples and Comparisons. All parts and percentages are by weight and all temperatures are degrees Celsius unless explicitly stated otherwise.

EXAMPLES

Example 1

Influence of Flood Exposure on Fogging Temperature

The negative-working printing plate DITP is a thermal printing plate precursor available from Kodak Polychrome Graphics LLC. The plates have been cut to a size of 38×615 mm and flood exposed to UV exposure (KOR 95; Kodak Polychrome Graphics LLC). Then the exposed plates were preheated at various temperatures by passing through a continuous oven (available from Techno Grafica; Germany) with a flow rate of 90 cm/min. The plate precursors were developed in a Mercury CTP processor (Kodak Polychrome Graphics LLC), equipped with an immersion type developing bath, a section for rinsing with water, and a gumming and drying section. The processor was filled with 60 L of 9005 developer (Kodak Polychrome Graphics LLC) at 24° C. Separately, a container for replenisher 9015 (Kodak Polychrome Graphics LLC) was attached from which 32 mL/plate was added to the developing bath via a pump.

The temperature of the first fog was determined and is given in Table 1. The correct working temperature is set at 5° C. below the first fog. The data show that fogging point is decreased after UV flood exposure.

TABLE 1

| UV Flood exposure (mJ/cm$^2$) | 0 | 5 | 10 | 15 |
|---|---|---|---|---|
| First Fog (° C.) | 149 | 147 | 145 | 141 |
| Working Temperature (° C.) | 144 | 142 | 140 | 136 |

To allow efficient thermal cross-linking, the working temperature should be kept as high as possible. Therefore, a flood exposure of 5 mJ/cm$^2$ is considered optimal.

Example 2

UV Flood Exposure Prior IR Imaging

DITP plates as described in Example 1 were flood UV exposed with 5 mJ/cm$^2$. The digital imaging was done by IR exposure at various energies from 100 to 180 mJ/cm$^2$ with a Trendsetter 3244 (Creo) at an energy of 9 W and a varying drum rotational speed to give strips of 100% solid areas. The plates are then preheated at 142° C. and developed as given in Example 1.

Figure 1:
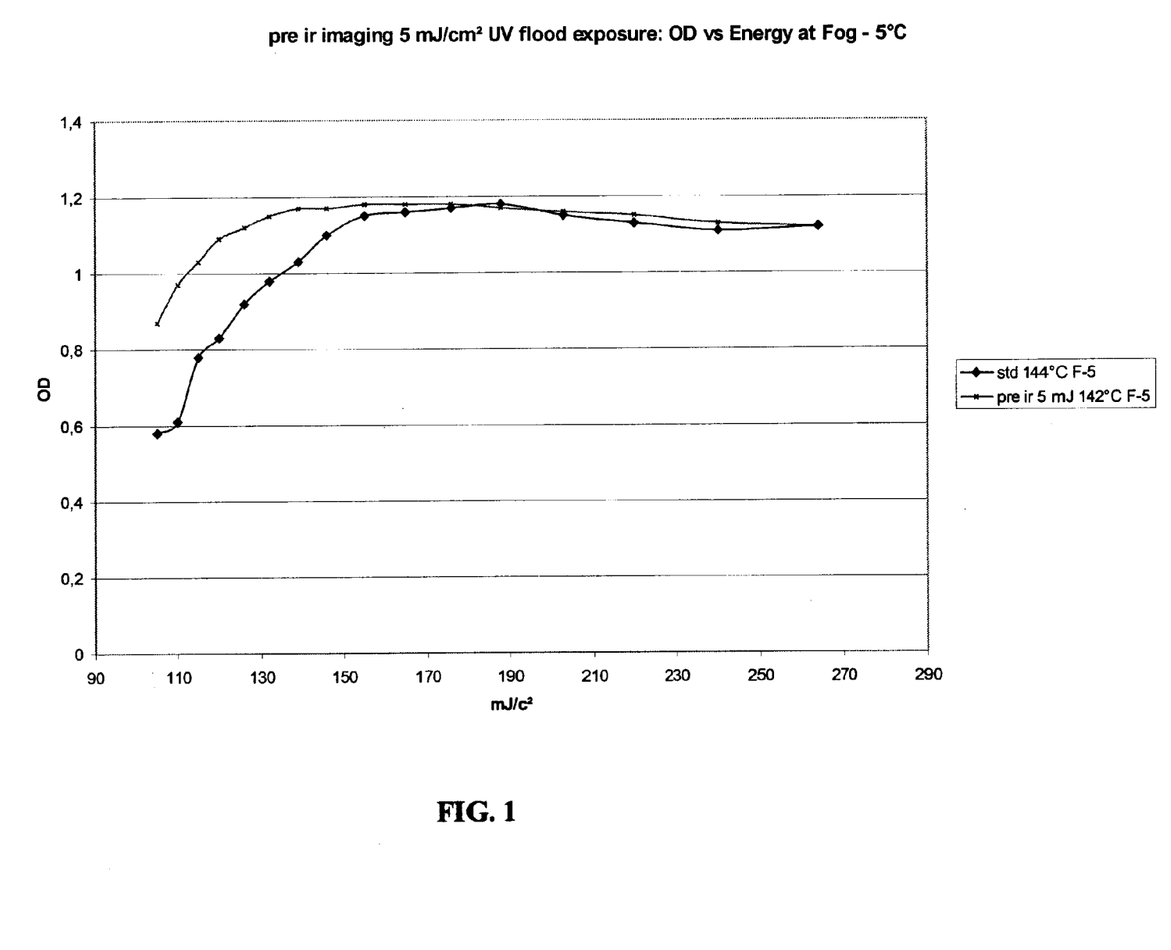
FIG. 1 is a graph of the measured processing conditions shown in Example 2 with a working temperature fogging point–5° C. (F–5).
Figure 2:
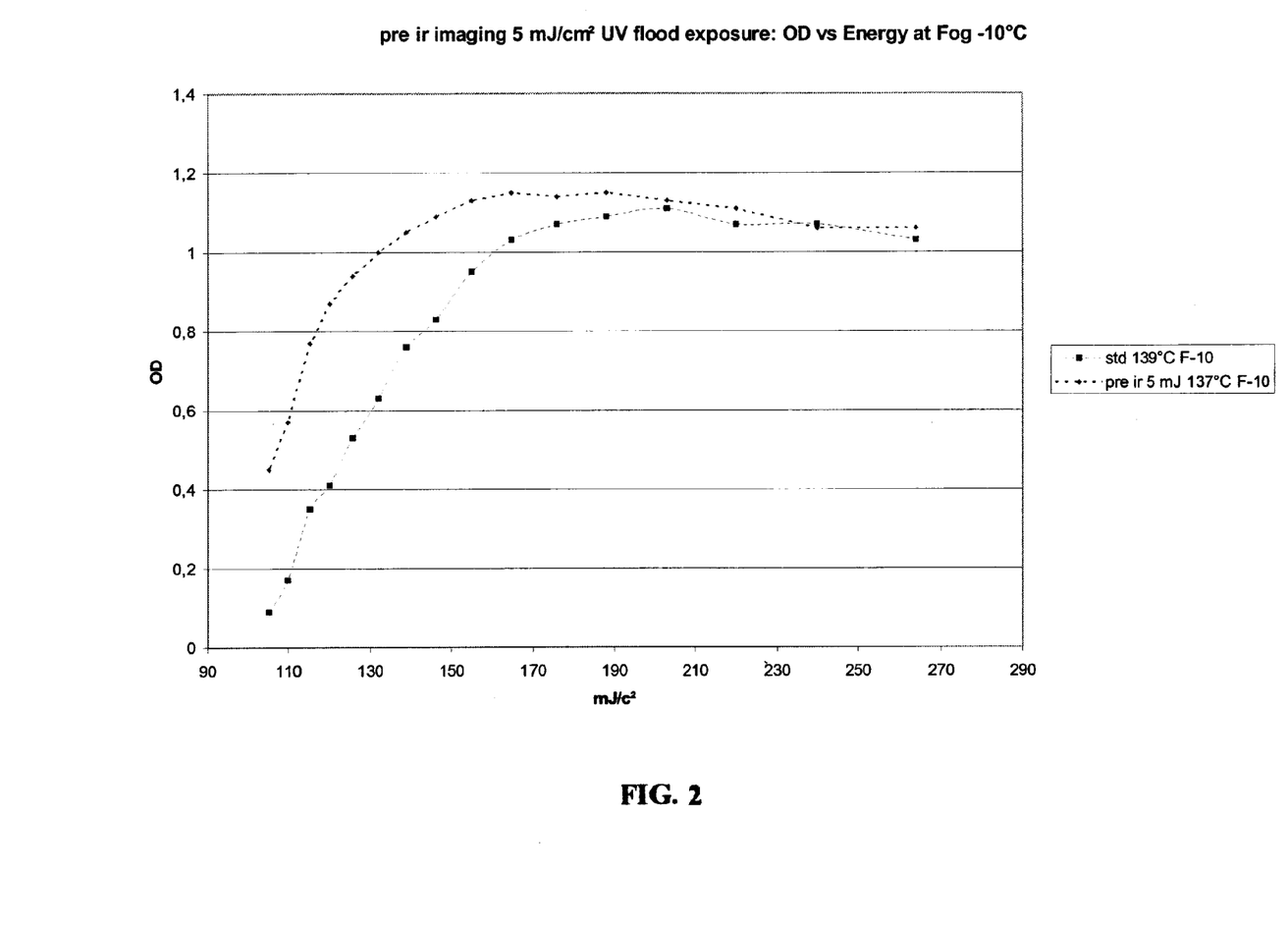
FIG. 2 is a graph of the measured processing conditions shown in Example 2 with a working temperature fogging point–10° C. (F–10).
Figure 3:
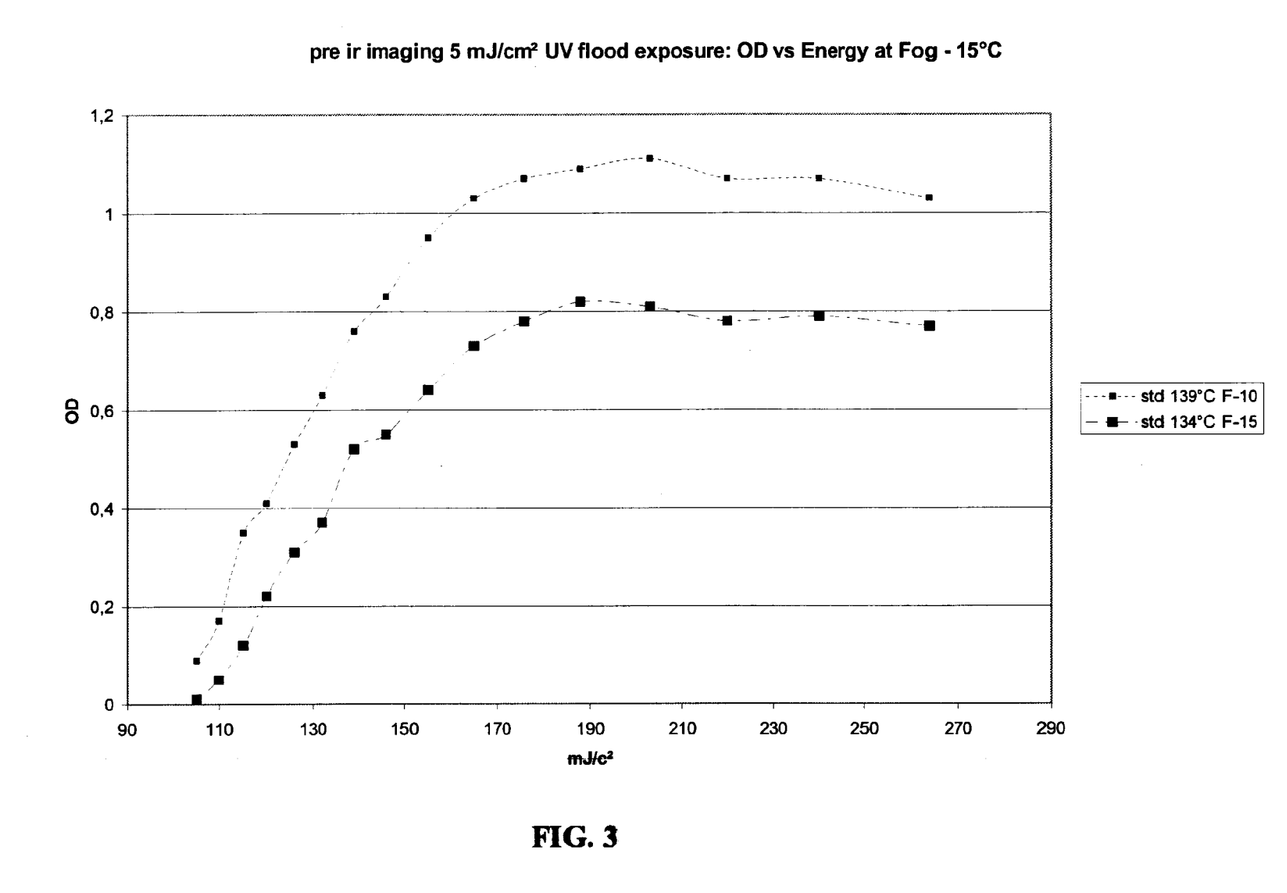
FIG. 3 is a graph of the measured processing conditions shown in Example 2 with a working temperature fogging point–15° C. (F–15).

To determine the preheat latitude, the plates are also preheated 10° C. and 15° C. below fog. The density measured at various energies are depicted in FIGS. 1, 2 and 3. The density reading of the imaged solid areas of the developed plate was measured using a D19C/D196 densitometer (Gretag/Macbeth) with a cyan filter.

The results show that DITP which has been UV flood exposed to 5 mJ/cm$^2$ UV prior IR imaging have a higher sensitivity and preheat latitude compared to standard processed plates.

Example 3

UV Flood Exposure After IR Imaging Prior Heating

Figure 4:
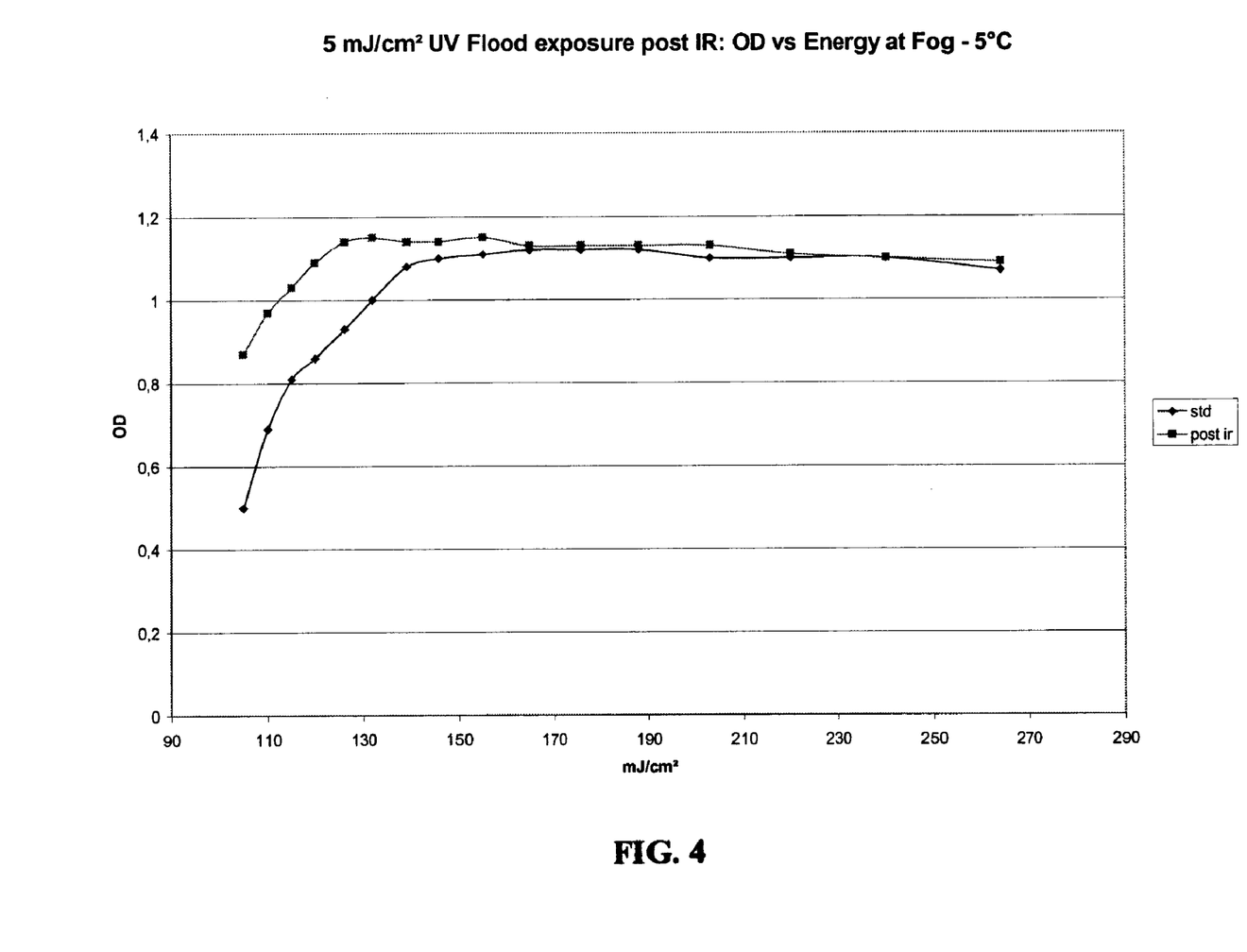
FIG. 4 is a graph measured densities for the processing conditions in Example 3.

Example 2 was repeated except the 5 mJ/cm$^2$ flood exposures were made subsequent to IR imaging. The results are depicted in FIG. 4.

Again, the results show that such plates have higher sensitivity as standard processed plates. Microbanding is observed on standard processed plates at exposure energies below 132 mJ/cm$^2$ whereas the UV flood exposed plates show microbanding below 115 mJ/cm$^2$ only. Therefore, an IR energy of 115 mJ/cm$^2$ can be used for exposure of DITP plates when a UV flood exposure takes place after IR imaging.

Comparative Example 1

UV Flood Exposure After Preheat

Figure 5:
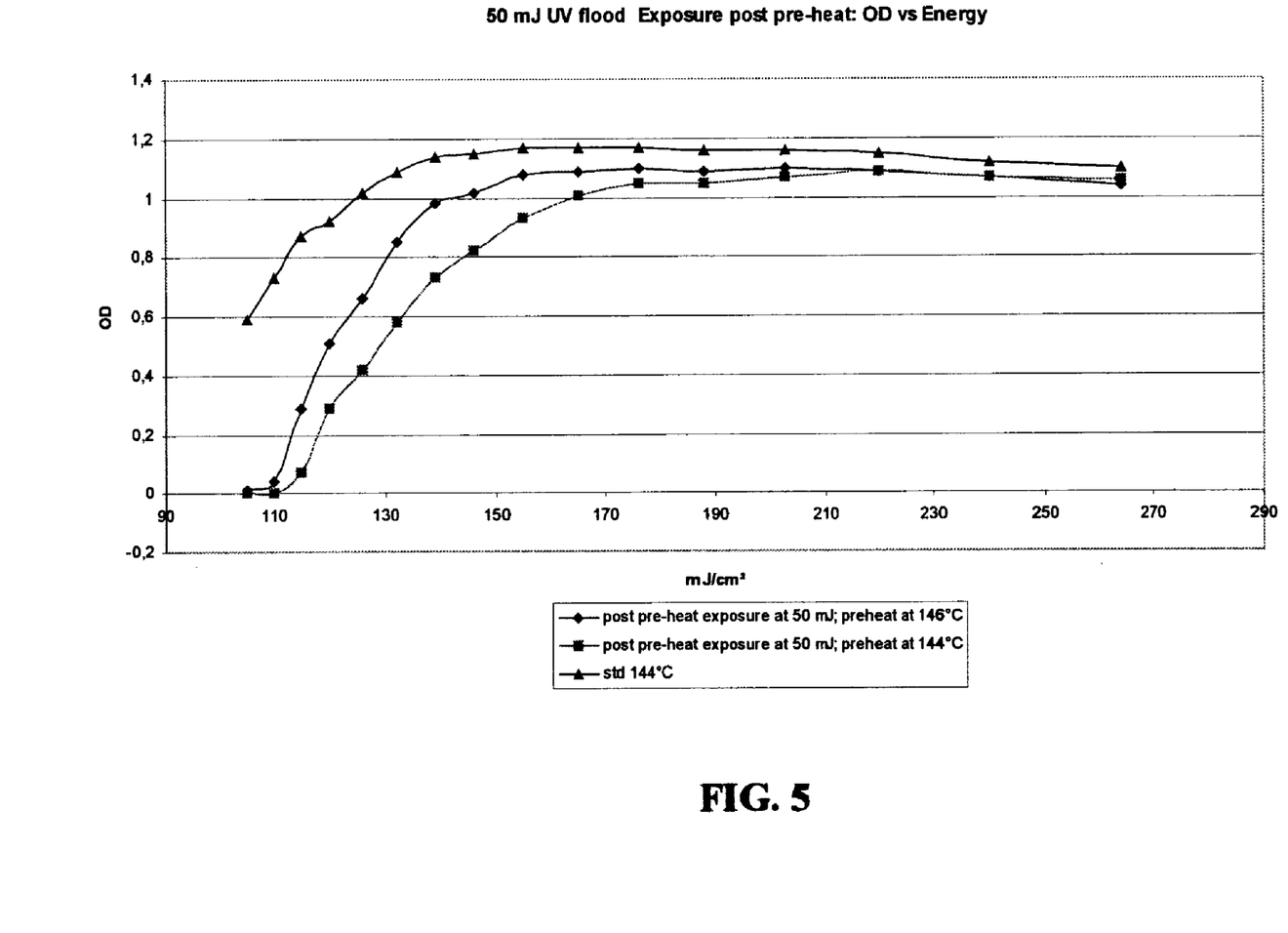
FIG. 5 is a graph of the measured densities for the processing conditions in the Comparison Example where the UV flood exposure occurs after the preheat step.

The plates were IR imaged and preheated as described in Example 2, then flood UV exposed with 50 mJ/cm and developed as given in Example 2. The results in FIG. 5 demonstrate the effect of UV flood exposure after the preheat. It can be seen that the density of plates with post UV exposure drops more rapidly giving a weaker image for the same working temperature. Even at standard working temperature the image performance is lower as this of standard processed plates.

When UV exposure energies <20 mJ/cm$^2$ were used, no difference in plate performance between standard processed and UV flood exposed plates was found.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A process for making thermally imageable negative working compositions comprising the steps of:
    (1) providing a patterning composition layer on a substrate, said patterning composition comprising:
        (a) at least one thermal-generated acid generator;
        (b) at least one cross-linking resin or compound;
        (c) at least one binder resin comprising a polymer containing at least one reactive pendent group selected from the group consisting of hydroxyl, carboxylic acid, sulfonamide, alkoxymethylamide and mixtures thereof; and
        (d) at least one infrared absorber;
    (2) subjecting the patterning composition layer to a two-stage radiation exposure;
        (a) one stage being a flood UV-exposure; and
        (b) the other stage being a imagewise infrared exposure stage;
    (3) treating the exposed patterning composition with heat energy; and
    (4) developing the heat treated, exposed patterning composition with an aqueous alkaline developer to remove the non-imaged areas of the patterning composition and leaving the imaged areas substantially unaffected.

2. The method of claim 1 wherein the two-stage radiation exposure step (2) is conducted with the first stage being a flood UV-exposure and the second stage being an imagewise infrared exposure.

3. The method of claim 1 wherein the two-stage radiation exposure step (2) is conducted with the first stage being an imagewise infrared exposure and the second stage being a flood UV exposure.

4. The process of claim 1 wherein the substrate is an aluminum plate.

5. The process of claim 4 wherein the aluminum plate is anodized before the patterning composition is coated thereon.

6. The process of claim 1 wherein the at least one thermal-activated acid generator is selected from the group consisting of straight or branched-chain $C_1$–$C_5$ alkyl sulfonates, aryl sulfonates, N-$C_1$–$C_5$ alkylsulfonyl sulfonamides, salts containing an onium cation and a non-nucleophilic anion and combinations thereof.

7. The process of claim 1 wherein the amount of thermal-activated acid generator is from about 1 to 25 weight percent of the patterning composition.

8. The process of claim 1 wherein the at least one crosslinking resin is selected from the group consisting of resole resins, $C_1$–$C_5$ alkoxymethyl melamine and glycoluril resins, poly ($C_1$–$C_5$ alkoxy-methylstyrene), poly ($C_1$–$C_5$ alkoxy-methylacrylamide) derivatives and combinations thereof.

9. The process of claim 1 wherein the amount of crosslinking resin is from about 5 to about 40 weight percent based on the weight of the patterning composition.

10. The process of claim 1 wherein the at least one binder resin is one or more polymers capable of undergoing an acid-catalyzed condensation reaction with the crosslinking resin at a temperature in the range of about 60° C. to about 200° C. to form a crosslinked polymer.

11. The process of claim 1 wherein the amount of the binder resin is from about 25 to 65 weight percent based on the weight of the patterning composition.

12. The process of claim 1 wherein the at least one infrared absorber is selected from the group consisting of dyes, pigments, and mixtures thereof.

13. The process of claim 1 wherein the amount of the infrared absorber is from about 2 to about 30 weight percent based on the weight of the patterning composition.

14. The process of claim 1 wherein the patterning composition additionally comprises (e) at least one UV sensitizer for acid generator (a).

* * * * *

UNITED STATES PATENT AND TRADEMARK OFFICE
CERTIFICATE OF CORRECTION

PATENT NO.    : 6,599,676 B2
DATED         : July 29, 2003
INVENTOR(S)   : Savariar-Hauck et al.

It is certified that error appears in the above-identified patent and that said Letters Patent is hereby corrected as shown below:

<u>Title page,</u>
Item [57], ABSTRACT,
Line 5, section (a), after "thermal" delete "generator" and insert therefore -- activated --

<u>Column 3,</u>
Line 66, delete "generated" and insert therefore -- activated --

<u>Column 11,</u>
Line 64, delete "generated" and insert therefore -- activated --

Signed and Sealed this

Eighteenth Day of November, 2003

JAMES E. ROGAN
*Director of the United States Patent and Trademark Office*